Sept. 15, 1959 N. E. LINDENBLAD 2,903,857

THERMOELECTRIC HEAT PUMP

Filed Sept. 24, 1956 2 Sheets-Sheet 1

INVENTOR.
Nils E. Lindenblad
BY Morris L. Rabkin
ATTORNEY.

Sept. 15, 1959 N. E. LINDENBLAD 2,903,857

THERMOELECTRIC HEAT PUMP

Filed Sept. 24, 1956 2 Sheets-Sheet 2

INVENTOR.
Nils E. Lindenblad
BY
Morris A. Rabkin
ATTORNEY.

United States Patent Office 2,903,857

Patented Sept. 15, 1959

2,903,857

THERMOELECTRIC HEAT PUMP

Nils E. Lindenblad, Princeton, N.J., assignor to Radio Corporation of America, a corporation of Delaware Application September 24, 1956, Serial No. 611,453

16 Claims. (Cl. 62—3)

The present invention relates to an improved thermoelectric heat pump, and more particularly to a thermoelectric heat pump that incorporates a novel structure especially adapted for purposes of cooling or heating a habitable enclosure.

The present invention is directed to providing a thermoelectric heat pump that may be located in, or as a part of, partitions separating two spaces or regions. One of the regions may be an inhabited enclosure, such as a home, factory, or other place of assembly. The other region may be the ambient or outdoor area around the inhabited enclosure. Heat may be pumped reversibly from one region to the other by means of the heat pump provided by the invention. In this way, the temperature and humidity in the enclosure can be controlled for maximum comfort by the cooling and heating action of the thermoelectric heat pump. The enclosure may be considered to have a thermal window which is provided by the thermoelectric heat pump of the present invention.

It has been difficult to provide thermoelectric heat pumps that may be readily installed in a partition, and which will operate as a thermal window with high efficiency. The problem has been further complicated by the relatively fragile nature of the elements of thermoelectric material that are incorporated in thermoelectric heat pumps. Any rough handling is likely to result in a fracture of one or more of the thermoelectric elements and the crippling of an entire heat pump assembly. Fragile thermoelectric heat pumps are also difficult to transport, particularly over long distances.

The structural features of a thermoelectric heat pump, provided in accordance with the present invention, substantially reduce the problems arising from the fragile nature of the thermoelectric materials. Installation of such heat pumps is highly simplified by virtue of their structural features. Final assembly of the heat pump at the installation site is possible. The heat pump operates efficiently without the need for additional means for dissipating excess heat under normal conditions. Many heat pumps, known in the art, operate successfully only with auxiliary fluid cooling systems that would incur complicated problems of construction and installation.

A heat pump, provided in accordance with the present invention, possesses great flexibility of application in that thermoelectric heat pumps can simply and readily be made available with a wide range of cooling capacities. The cooling capacity of a previously installed heat pump of the type provided by the invention may also be easily increased or decreased, if desired.

Briefly described, a thermoelectric heat pump constructed in accordance with the present invention may incorporate a number of improved thermoelectric heat pump units which are reversibly operative for heating and cooling purposes. Each of these thermoelectric heat pump units is a mechanically sturdy, unitary structure which may be easily handled and installed in accordance with simplified building construction techniques. A plurality of thermocouple elements comprises each thermoelectric heat pump unit. Each of the thermocouple elements includes a member for lending structural support thereto. This member functions as a heat exchange terminal for the element. It functions to dissipate heat in one mode of operation and to absorb heat in the reverse mode of operation. At least one body of thermoelectric material is attached, at one of its ends, to the supporting member of each element. Other heat exchange terminal members, which may function as heat absorbing terminals in the one mode of operation, and as heat dissipating terminals in the reverse mode of operation may be attached individually to the other end of each of the bodies of thermoelectric material. All of the thermoelectric elements are aligned end-to-end in a row. Adjacent ones of the support members are interconnected by means which provide a sturdy connection therebetween. A unitary structure that may be of narrow, elongated shape and which has support lending heat exchange terminals spaced opposite from the other heat exchange terminals thereof is, therefore, provided.

A bracket or other mounting means may be provided into which any desired number of the above-described thermoelectric heat pumping units may be assembled in side-by-side relationship. The number of units used may be commensurate with the cooling or heating capacity requirements for the assembly. The support lending members provide a large heat exchange surface to the outdoors so that the efficiency of the unit is good. Since each heat pumping unit is independent, a heat pump of any desired cooling or heating capacity may be easily assembled at the site of construction for installation in any desired location, such as a wall of a room as a thermal window. The individual character of each heat pumping unit and its elementary construction substantially eliminates the problem of breakage due to accidents in handling and simplifies repairs.

It is, therefore, an object of the present invention to provide an improved thermoelectric heat pump structure.

It is a further object of the present invention to provide a thermoelectric heat pump that may be installed as a thermal window and may be used reversibly for heating or cooling an enclosure.

It is a still further object of the present invention to provide an improved thermoelectric heat pump structure that is mechanically rugged and easily assembled.

It is a still further object of the present invention to provide an improved thermoelectric heat pump that may be readily constructed with a desired cooling or heating capacity.

It is a still further object of the present invention to provide an improved thermoelectric heat pump which may be readily manufactured in accordance with mass production techniques.

Other objects and advantages of the present invention will, of course, become apparent and immediately suggest themselves to those skilled in the art to which the invention is directed from a reading of the following specification in connection with the accompanying drawings in which.

Figure 2:
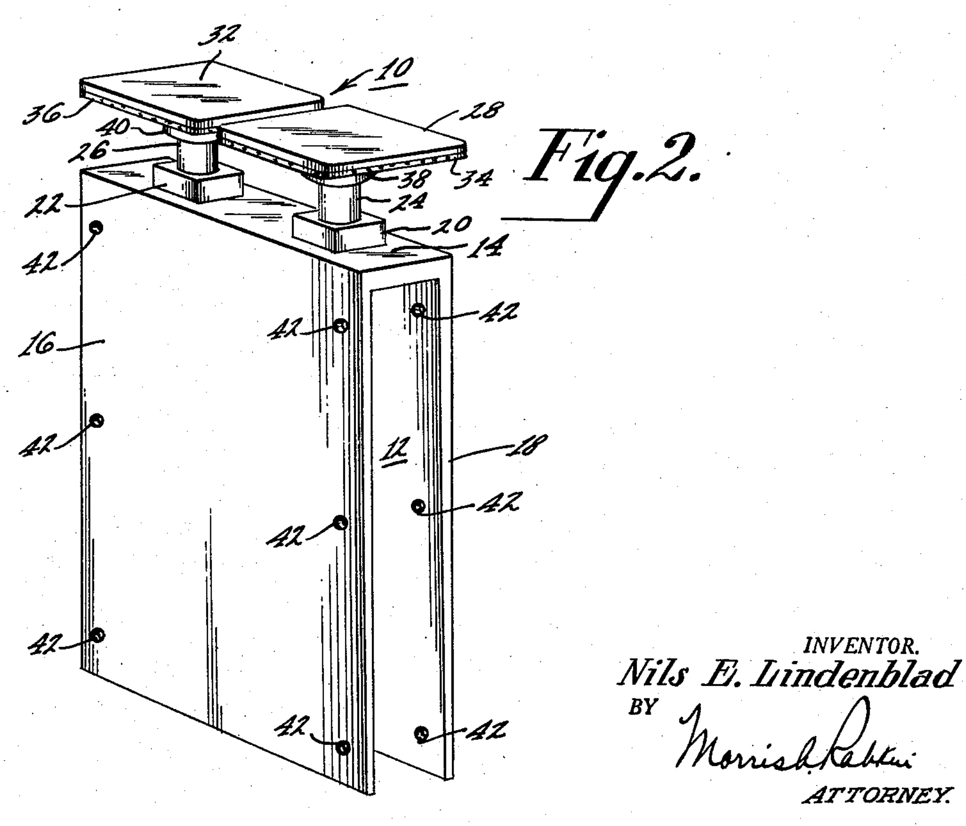
Fig. 2 is a perspective view of a typical one of the individual thermoelectric cooling elements of a thermoelectric heat pump constructed in accordance with the present invention.

Referring to the drawings, and particularly to Fig. 2 thereof, there is shown an individual thermocouple element 10, which is illustrative of the type of thermocouple elements incorporated in a thermoelectric heat pump that may be constructed in accordance with the present invention. The member providing support for the element 10 is a structural member in the form of a channel. The channel 12 may be formed from extruded aluminum or another metal having good thermal and electrical conductive properties. The channel 12 functions as a heat exchange terminal. It is a heat dissipating terminal, in the mode of operation discussed herein for purposes of illustration, but will act as a heat absorbing terminal in the reverse mode of operation. It may be observed that this member 12 consists of a web portion 14 and depending flange portions 16 and 18. The web portion is narrow and rectangular in shape. The flange portions 16 and 18 are wide and long thereby providing a large heat exchange surface. It may be desirable to use tapered flange members 16 and 18, as illustrated in the drawings, so that each is of lesser thickness in the region towards the open end of the channel 12. Since such tapered members may be made with less metal than straight members, they are used in the interest of economy of materials. The web portion 14 of the channel is machined to provide two substantially rectangular bosses 20 and 22 on the outer surface thereof. The bosses 20 and 22 provide for convenience in the connection of other parts to the channel 12.

Cylindrical bodies of dissimilar thermoelectric materials 24 and 26 are secured by a soldering technique, for example, to the surface of the bosses 20 and 22, respectively. Each of the bodies 24 and 26 may be made from a material or alloy having dissimilar thermoelectric properties such that cooling or heating would, respectively, result at a junction therebetween, when a current is passed through them in one direction or the other. Such cooling of heating results from the phenomena known as the Peltier effect.

By virtue of the characteristics of the dissimilar thermoelectric materials of the bodies 24 and 26 that are used in the thermoelectric element 10, it is possible to reversibly translate thermal energy into the form of elevated electronic potential energy. Energy can be translated from thermal energy to potential electronic energy at one end of a body of thermoelectric material, and from potential electronic energy to thermal energy at the other end of the body of thermoelectric material. When the translation is from thermal to potential electronic energy, a heat loss results. Where the potential electronic energy is translated into thermal energy, a heat gain occurs. Heat loss results in a cooling effect, while a heat gain causes a rise in temperature. Energy for heat transfer is supplied by an electric field established across the joint bodies 24 and 26 of dissimilar thermoelectric material. The direction of heat transfer may be reversed by reversing the direction of the electric field across the bodies of thermoelectric material. This may be done by reversing the polarity of voltage applied across the element. In the embodiment of the invention, illustrated herein, the direction of the electric field is oriented such that heat gain occurs at the ends of the bodies of dissimilar electric material 24 and 26, which are secured to the channel 12.

The thermoelectric material of one of the bodies 26 may be an alloy of bismuth, antimony and tellurium, while the other of the bodies 24 may be of any desired complementary thermoelectric composition, such as lead telluride or another form of bismuth-telluride, for example. A more detailed description of thermoelectric materials suitable for use in connection with the present invention may be found in a patent application filed in the name of Nils E. Lindenblad, Serial No. 465,806, on November 1, 1954, now Patent 2,762,857, issued September 11, 1956.

A plate 28 of thermally and electrically conductive material, such as copper or aluminum, which is formed with a boss 30 (best observed in Fig. 4), is attached to the upper end of the cylindrical body 24 of thermoelectric material. The bottom of the boss portion 30 of the plate 28 may be fastened by a soldering technique to the upper end of the body of thermoelectric material. Another plate 32, similar to the first mentioned plate 28 in construction, is attached to the top end of the other body of thermoelectric material 26. The plates 28 and 32 lie in substantially the same plane and the sides thereof are in substantial alignment. These plates 28 and 32 function as heat absorbing terminals in the illustrative thermoelectric heat pump described in detail herein.

Individual sheets 34 and 36 of a dense insulating material, such as cork, are cemented to the underside of each of the plates 28 and 32. Collars 38 and 40 of a similar insulating material are cemented around the boss portions 30 located on the underside of each of the plates 28 and 32.

The outer surfaces of the collars 38 and 40 and the sheets 28 and 32 of insulating material are coated with a reflective coating, such as aluminum paint. This provides a heat reflective surface whereby heat being dissipated from the channel member 12 by radiation that is incident upon the heat absorbing plates 28 and 32 is reflected therefrom. The cork sheets 34 and 36 and the collars 38 and 40 are of further use in preventing condensation of moisture on the underside of the plates 28 and 32. The paint also serves to moisture-proof the reflective surface of the cork.

Further insulation to prevent the convective flow of air between the channel 12 and the heat absorbing plates 28 and 32 may be provided in the form of insulation arranged between the underside of the plates 28 and 32 and the surface of the web portion 14 of the channel 12. This insulating material may be a solidified foam plastic material of the type sold under the trade name "Styrofoam." "Styrofoam" designates a foamed polystyrene plastic material.

It may be observed that a plurality of holes 42 are drilled in the flange portion 16 and 18 near edges thereof. These holes are provided for the interconnection of a plurality of individual thermocouple elements into a unitary heat pumping structure, as will be described hereinafter.

Figure 3:
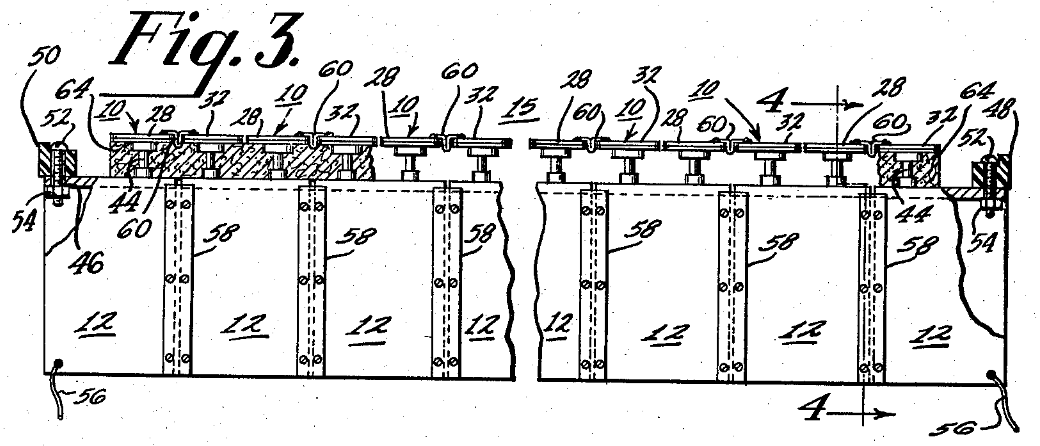
Fig. 3 is a side elevation of a thermoelectric cooling unit illustrating the novel structure provided by the present invention.

A completed, unitary thermoelectric heat pump structure 15 is shown in Fig. 3. This unit consists of a plurality of individual thermocouple elements 10. The channel members 12 of each element 10 are desirably of the same length. In the interest of providing a standard heat pump assembly of the novel type to be described hereinafter, it is desirable to use a like number of thermoelectric elements 10 in each unit 15 so that the cooling units may be of standard length. In constructing the thermoelectric heat pump unit 15, the thermoelectric elements 10 may be lined up longitudinally in a row such that dissimilar bodies of thermoelectric material in the different elements 10 are adjacent each other. The channel elements may be disposed end-to-end on a form such as a rectangular beam. Thus, the flange and web portions of all of the channels 12 will be in alignment. The aligned flange and web portions of each channel 12 result in the formation of a continuous duct or passageway extending longitudinally of the unit 15. This duct or passageway defines a path of flow for a cooling draft of air over the heat dissipating channels 12 and enhances the exchange of heat between the channels 12 and the ambient medium.

The end ones of the thermocouple elements 10 are illustrated as including a single cylindrical body of thermoelectric material 44 and a heat absorbing plate 28, which is attached thereto, instead of a pair of bodies 24 and 26 of dissimilar thermoelectric materials. Each of these bodies 44 consists of thermoelectric material that is dissimilar from the material of the body of thermoelectric material disposed adjacent thereto. Thus, the bodies of thermoelectric material 44 will cooperate with their adjacent bodies of thermoelectric material to form a cold junction therebetween in one mode of operation of the unit 15. The use of thermoelectric elements 10 having a single body of thermoelectric material at the ends of the heat pump unit 15 makes it unnecessary to make connections to the heat absorbing terminals provided by the plates 28 and 32 of the thermoelectric elements 10, when several heat pump units 15 are assembled together.

Holes 46 are drilled near the outer end of the web portion of the thermoelectric elements 10 which are disposed on the ends of the thermoelectric heat pump unit 15. These holes are for the purpose of mounting the thermoelectric heat pump unit in a bracket, for example. Part of an exemplary mounting bracket is shown in Fig. 3 as comprising the rods 48 and 50 composed of insulating material, such as plastic. Bolts 52 are passed through holes in the rods and through the holes 46 in the end ones of the thermoelectric elements 10. Nuts 54, which are threaded onto the ends of the bolts 52, are used to fasten the unit 15 to the bracket rods 48 and 50. Power input conductors 56 are connected, as by soldering, to the channel heat dissipating members 12 of the end ones of the thermocouple elements 10. These conductors 56 may be used for connection to a suitable source of direct current voltage for operating the thermoelectric heat pump unit 15. The conductors 56 also provide means for connection of the unit 15 in series with other units when a heat pump assembly comprising a plurality of heat pump units is desired. Interconnection of the heat absorbing terminals of different heat pump units 15 is made unnecessary due to the use of heat pump elements having single bodies of thermoelectric material at the ends of each of the units 15. Detrimental heat conduction through the power input conductors is also prevented.

A feature of the present invention is that it provides a thermoelectric heat pump unit which is a unitary structure. It was mentioned above that the channels 12 are aligned in end-to-end relationship by the use of an aligning form, such as a straight beam, on which all of the channels 12 are seated. Each of the channels 12 is spaced from the next adjacent channels leaving short gaps therebetween. A unitary structure is provided by means which interconnect the adjacent elements. Such means are illustrated herein as rigid plates 58 of insulating material, which are provided with holes that are complementary to the holes 42 in each of the channels 12 of the thermoelectric elements 10. The interconnecting plates 58 may be constructed from plastic material. Materials in the class of plastic laminated fibers will be found suitable. The plates 58 are rigidly fastened to the flange portions of the channel members 12 by means of screws, which may be of the self-tapping variety. It will be observed from Fig. 4 that the plates 58 are secured to both flanges 16 and 18 of each of the channels 12 and bridge the gap between the ends of adjacent ones of the channels 12.

The plates 28 and 32, which provide heat absorbing terminals on different ones of the thermoelectric elements 10, are connected by means of flexible connector strips 60. These strips are constructed of thin metal segments, such as copper ribbon, which are formed in the shape of a flanged U. The flange portions of the connector strip 60 are secured, as by soldering, to the top surfaces of each of the plates 28 and 32 to be connected to each other. It may be observed that the connector strips 60 also bridge the gap between adjacent ones of the thermolectric elements 10. The strips 60 and the heat absorbing plates 28 and 32, interconnected thereby, provide the cold junctions of the thermocouple cooling element. The heat dissipating channel members 12 provide the hot junctions thereof. The surfaces of the connector elements 60 and the plates 28 and 32 may be coated by painting with paint of a heat absorbing color, such as a dull green or black, to enhance their heat exchange efficiency. Mechanical stresses on the relatively fragile bodies of thermoelectric material 24, 26, and 34 are reduced since there is no structure with the exception of the flexible connector strips 60 which is attached to the heat absorbing terminal plates 28 and 32.

As was mentioned theretofore, an insulating filler is provided in the space between the bottom of the heat absorbing plates 28 and 32 and the top of the web portion 14 of the heat dissipating channel members 12. This insulating filler serves the purpose of stopping convective flow of air between the heat dissipating members and cooperates with the heat reflecting coating on the underside of the sheets 34 and 36 and the collars 38 and 40 of dense insulating material at the bottom of the heat absorbing plates 28 and 32 so as to increase the efficiency of the heat pump unit 15. Bars of foamed plastic material 62 and 64, which may be of the type referred to above, are formed to fit into the space between the cork sheets and the web portions of the channels 12 on opposite sides of the thermoelectric pumping unit 15, and are each internally shaped to conform substantially to the contour of the collars, bosses and cylindrical bodies of thermoelectric material.

The unitary structure provided by the rigid interconnection of the heat dissipating channel members 12 by the insulating plates 58 is mechanically rigid so that the entire unit 15 may be easily handled. The narrow elongated shape of the unit also simplifies problems in the shipping and handling. Moreover, the elementary construction of the unit 15 from individual thermoelectric elements 10 simplifies any necessary repairs. Each unit may be constructed to meet standard specifications. Any number of units may be mounted in assembled relationship, as in a bracket or frame, to provide a heat pump of the desired cooling capacity. The adaptability of the units 15, provided by this invention, to be constructed to meet standard specifications from individual thermocouple elements 10 makes such units easily manufacturable in accordance with mass production techniques.

The assembly of a plurality of units 15 of the type provided by the present invention is an extremely simple operation. The easily handled heat pump units 15 need only be connected by means of two bolts, as illustrated in Fig. 3, to a suitable mounting bracket. The electrical connections may be completed with two conductors 56, which are connected to the outer ones of the heat dissipating channels 12. All of the units may be easily connected together in series.

Figure 1:
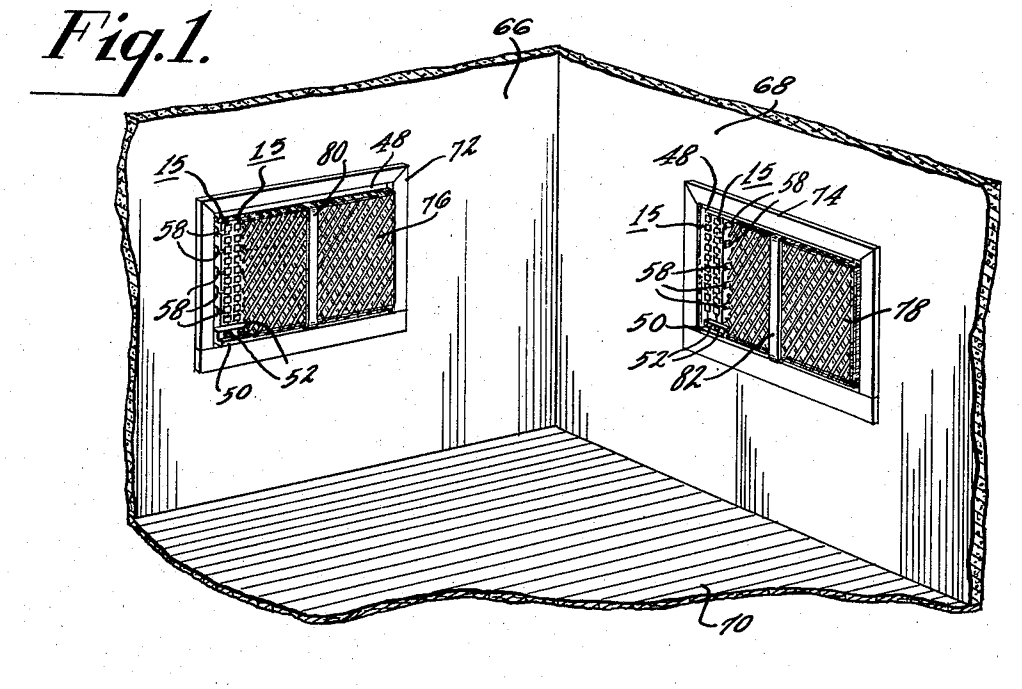
Fig. 1 is a perspective view of a corner of an inhabitable enclosure, such as a room, in the walls of which are mounted thermoelectric heat pump assemblies of the present invention.
Figure 4:
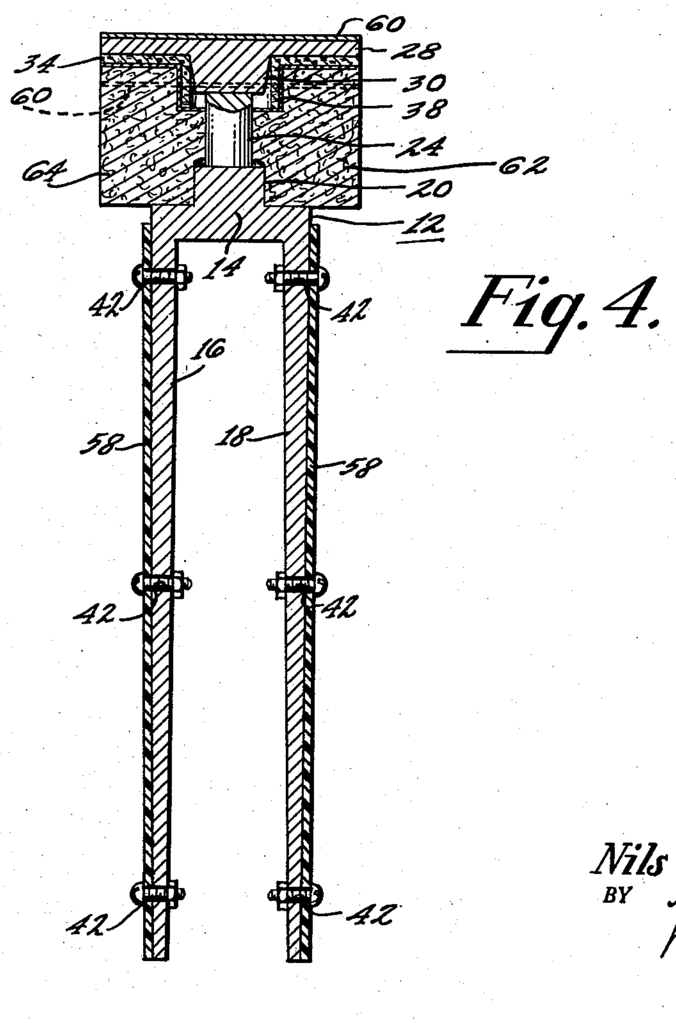
Fig. 4 is a cross-sectional view of the cooling unit of Fig. 3, the section being taken along the line 4—4 of Fig. 3 as viewed in the direction of the arrows.

Fig. 1 shows a typical installation, as a thermal window, of a heat pump comprised of units 15 of the type provided by the present invention and illustrated in Figs. 3 and 4. A corner of a room is shown. This corner is provided by the intersection, at right angles, of two walls 66 and 68. Rectangular openings are made in each of the walls 66 and 68. These openings may be at any desired level above the floor 70. Mounting brackets 72 and 74 may be secured around the periphery of the openings and to provide a frame for the thermal window. These mounting brackets 72 and 74 are shown herein to be of rectangular shape. They may be constructed from aluminum strips or bars in a conventional manner. Insulating rods 48 and 50 of the type shown in Fig. 3 may be secured along the top and bottom members of the mounting brackets 72 and 74. A number of thermoelectric heat pump units 15, the number being commensurate with the cooling capacity desired, are secured in the mounting brackets 72 and 74. The units 15 are desirably spaced from each other by equal distances. These heat pump units may be mounted in the manner shown in Fig. 3 on the insulating bars 48 and 50. In the illustrative showing of Fig. 1 the units 15 are mounted vertically so that the longitudinal passageways or ducts extending therethrough will be parallel to each other.

This construction may be observed to afford convenience of installation, and will reduce the possibility of damage to the thermocouple elements since all connections of the units 15 to the brackets are made to the channels 12.

The heat absorbing terminals of the units 15 are all disposed to face towards the region in the interior of the room while the channels, which provide heat dissipating terminals, face towards the outdoors. The walls 66 and 68 are desirably the exterior walls of the building, such that the heat dissipating terminal members may be cooled by the outdoor air. Since the heat dissipating or outdoor terminals are provided by the channels, they have a large heat exchange area and maintain a temperature close to that of the ambient. The vertical, parallel ducts provided by the channels, as mentioned heretofore, establish a draft which passes therethrough and enhances the heat exchange efficiency of the thermal window. The direction of the draft depends upon whether the thermal window is used to heat or cool the indoor region. In the latter case, the draft will be an updraft.

A grill 76 may be mounted on the bracket 72 and over the heat absorbing terminals of the thermoelectric elements. Also, a grill 78 is shown as occupying a similar position in the other bracket 74. The brackets 72 and 74 also include vertical bars 80 and 82 which aid in holding the grills 76 and 78 in place and lend themselves to providing a pleasing appearance for the heat pump assemblies. The grills 76 and 78 further protect against the possibility of accidental contact with the cooling elements. Although there is no significant danger of electric shock due to the low voltages that are normally employed, it is desirable to protect the thermocouple elements against accidental breakage.

As mentioned above, the vertically arranged units 15 may be connected in a series electrical circuit which is energized by a suitable source of direct current voltage.

A thermoelectric heat pump of unique construction has been described which is well adapted for installation as a thermal window for cooling places of habitation. When operated, in the reverse mode of operation, the window can be used for heating purposes. The heat pump assembly may be readily mounted in a part of a window and functions directly as a room air conditioner. The structural and operational characteristics of the thermal window heat pump assembly of this invention provide important improvements over conventional mechanical and absorption refrigeration devices.

What is claimed is:

1. A thermoelectric heat pump assembly of unitary construction comprising a plurality of thermocouples, each of said thermocouples including a body of thermoelectric material and an electrically and thermally conductive member secured thereto for providing a heat exchange terminal for each said thermocouple, said member being mechanically rigid for providing structural support for said body of thermoelectric material, means for connecting said thermocouples together, and said connecting means being secured to each of said members whereby to provide said unitary construction.

2. A thermoelectric heat pump assembly of unitary construction comprising a plurality of thermocouples, each of said thermocouples including a body of thermoelectric material and an electrically and thermally conductive member providing a heat exchange terminal for each said thermocouple, said member being mechanically rigid for providing structural support for said body of thermoelectric material, said members all extending from said bodies in a like predetermined direction, mechanical connectors, and means for securing said connectors to each of said members for providing said unitary construction.

3. A thermoelectric heat pump assembly of unitary construction comprising a plurality of thermocouples, each of said thermocouples comprising at least one body of thermoelectric material, a member extending from said body in a predetermined direction, and an electrically and thermally conductive member, said member being mechanically rigid for providing structural support for each said body of thermoelectric material said electrically and thermally conductive member extending from said first named member in a direction different from said predetermined direction, and mechanical connectors secured to each of said electrically and thermally conductive members for assembling them together whereby to provide said unitary construction.

4. A thermoelectric heat pump structure comprising a plurality of thermocouple elements, each of said elements comprising at least one body of thermoelectric material and an electrically and thermally conductive member to which said body is electrically and mechanically attached, said member providing an electrical and thermal terminal of each said thermocople element, and rigid connectors disposed between adjacent ones of said members and secured thereto whereby said elements are assembled in a mechanically rigid unitary structure.

5. A thermoelectric heat pump structure comprising a plurality of thermocouple elements, each of said elements comprising at least one body of thermoelectric material and an electrically and thermally conductive member to which said body is electrically and mechanically attached, at one end thereof, said member providing a mechanical and electrical terminal for each said element, said member being mechanically rigid and having a passageway therethrough, individual rigid connectors disposed between adjacent ones of said members and secured thereto whereby said elements are assembled in a mechanically rigid unitary structure, and said passageways of said members being disposed in alignment to provide a continuous passageway through said assembled elements.

6. A thermoelectric heat pump comprising a unitary structure having a plurality of individual thermally and electrically conductive structural members, means secured to each of said members for the assembly thereof in end-to-end relationship into a unitary, structurally rigid member, at least one body of thermoelectric material electrically and mechanically secured on each of said individual members, and conductive means connected to said bodies for connecting said bodies and said individual members together into a common, continuous electric circuit.

7. A thermoelectric heat pump comprising a unitary structure having a plurality of individual thermally and electrically conductive structural members, each of said individual members having a duct therethrough, means secured to each of said individual members for the assembly thereof with said ducts in aligned communicating relationship into a unitary, structurally rigid member, at least one body of thermoelectric material electrically and mechanically secured at one end thereof on each of said individual members, and means electrically connecting said bodies together at the opposite ends thereof to provide with said individual members a continuous common electric circuit.

8. A thermoelectric heat pump structure comprising a plurality of thermocouple elements, each of said elements including at least one body of thermoelectric material, a first heat exchange terminal member constituted of thermally and electrically conductive material supporting said body, a second heat exchange terminal member secured to said body at an end thereof opposite said first terminal members, rigid insulating connectors secured to each of said first terminal members for connecting the ends thereof together providing a structurally rigid unitary structure, and means for interconnecting said second terminal members into a common electric circuit with said bodies of thermoelectric material and said first terminal members.

9. A thermoelectric heat pump comprising a plurality of thermocouple elements, each of said elements including a channel member, said channel member having a web portion and a pair of flanges appended to one side of said web portion, at least one body of thermoelectric material being secured at one end thereof to the side of said web portion opposite from said one side in each of said elements, rigid plates of insulating material, said channel members being disposed in a row with webs and flanges of adjacent ones of said channel members spaced from and aligned with each other, said plates being attached to said flanges of said adjacent ones of said channel members in said row to maintain said channel members in aligned relationship in said row, and conductive means inter-connecting the other of said ends of alternate ones of said bodies of thermoelectric material disposed along said row.

10. A thermoelectric heat pump structure comprising a plurality of channel members, each of said channel members having a web portion and flange portions, said flange portions depending from opposite sides of said web portion, said channel members being spaced from each other to provide a gap therebetween and disposed in a row with said web and flange portions thereof in alignment, rigid strips of thermally and electrically insulating material bridging said gap between said adjacent channel members and secured to the flange portions thereof, cylindrical bodies of thermoelectric material attached at one end thereof to the surface of said web portions of each of said channel members opposite from said flange portions thereof, adjacent ones of said bodies being composed of dissimilar thermoelectric materials, individual plates of thermally and electrically conductive material secured to the end of each of said bodies of thermoelectric material opposite from the end thereof attached to said web portions, each of said plates being in substantially the same plane, and means electrically connecting alternate pairs of adjacent ones of said plates whereby said plates and said channel members will reversibly provide heat absorbing junctions.

11. The heat pump structure, according to claim 10,, including individual sheets of insulating material attached to the surface of each of said plates facing said web portions, and a heat reflective coating disposed on the face of said sheets of insulating material facing said web portions.

12. A thermoelectric heat pump assembly comprising a bracket having at least two parallel sides, a plurality of thermoelectric heat pump units of elongated narrow shape, said heat pump units being provided with heat dissipating terminals on one side thereof and heat absorbing terminals on the opposite side thereof, said heat dissipating terminals being rigidly inter-connected to provide structural support for said unit whereby each of said units is a unitary structure, and said units being attached between said sides of said bracket and at spaced positions along said sides.

13. A thermoelectric heat pump assembly comprising means providing an opening having at least two parallel sides, a plurality of thermoelectric heat pump units of elongated narrow shape, said heat pump units being provided with heat dissipating elements on one side thereof and heat absorbing elements on the opposite side thereof, said heat dissipating elements being rigidly interconnected to provide structural support for said unit whereby each of said units is a unitary structure, and said heat dissipating members at opposite ends of each of said units being attached between said parallel sides and at spaced positions along said sides.

14. A thermoelectric heat pump assembly comprising a bracket having at least two parallel sides opposite to each other, a plurality of thermoelectric heat pump units, each of said heat pump units being provided with heat dissipating elements on one side thereof and heat absorbing elements on the opposite side thereof, said heat dissipating elements each providing a narrow duct extending longitudinally therethrough, means for rigidly interconnecting said heat dissipating elements such that said ducts are disposed to communicate with each other to provide a duct extending longitudinally of said unit, said last-named means providing structural support for said unit whereby each of said units is a unitary structure, and means for mounting heat pump units between said sides of said bracket with said longitudinal ducts of each of said units disposed parallel to each other and spaced from each other.

15. A thermal window thermoelectric heat pump assembly for installation in a partition separating a region from which heat is to be taken from a region into which heat is to be dissipated comprising a frame having at least two parallel opposite sides, said partition having an opening in which said frame is adapted to be installed, a plurality of thermoelectric heat pump units mounted in said frame, each of said heat pump units being provided by a unitary structure of rigidly interconnected thermoelectric elements, each of said elements comprising a channel supporting member having a web and a pair of flanges defining a duct, at least one body of thermoelectric material attached to the web of said channel at one end thereof and a plate of thermally and electrically conductive material connected to said body at the opposite end thereof, insulating means for rigidly interconnecting each of said channels in said units so that the flanges thereof are in alignment with each other whereby said ducts of each of said channels provide a continuous passageway longitudinally of each of said units, means for attaching the ones of said channels at opposite ends of each of said units to said parallel opposite sides of said frame, said position of attachment of each of said units being spaced from the position of attachment of the unit adjacent thereto, said plates of each of said units being disposed in said region from which heat is to be taken, and said channels being disposed in said region into which heat is to be dissipated.

16. A thermoelectric heat pump structure comprising a plurality of thermocouples, each of said thermocouples including a first terminal member which is a mechanically rigid length of thermally and electrically conductive material, at least one body of thermoelectric material secured at one end thereof to said first terminal member, a second terminal member of thermally and electrically conductive material, said body of thermoelectric material being secured to said second terminal member at the opposite end of said body, two of said thermocouples each having a single one of said bodies of thermoelectric material therein, the thermoelectric material of said single bodies in said last two named thermocouples being dissimilar from each other, the other of said thermocouples each having a pair of bodies of dissimilar thermoelectric material spaced from each other and secured at opposite ends thereof to said first and said second terminal members respectively, said thermocouples being longitudinally aligned in a row with dissimilar ones of said bodies on different ones of said thermocouples disposed adjacent each other, said thermocouples having said single bodies of thermoelectric material disposed at opposite ends of said row, rigid insulating members attached to said first terminal members for maintaining said thermocouples in alignment thereby providing a unitary structure, and flexibly conductive connectors connected by the adjacent ones of said second terminal members on different ones of said thermocouples in said row.

References Cited in the file of this patent

UNITED STATES PATENTS

| | | |
|---|---|---|
| 420,641 | Dewey | Feb. 4, 1890 |
| 1,741,870 | Mieville | Dec. 31, 1929 |
| 1,818,437 | Stuart | Aug. 11, 1931 |
| 2,787,140 | Peterson | Apr. 2, 1957 |

FOREIGN PATENTS

| | | |
|---|---|---|
| 259,564 | Great Britain | July 21, 1927 |
| 700,013 | France | Dec. 17, 1930 |